United States Patent
Yun et al.

(10) Patent No.: US 8,625,109 B2
(45) Date of Patent: Jan. 7, 2014

(54) METHOD OF DETERMINING AN OVERLAP DISTANCE OF AN OPTICAL HEAD AND DIGITAL EXPOSURE DEVICE USING THE METHOD

(75) Inventors: Sang-Hyun Yun, Suwon-si (KR); Hi-Kuk Lee, Yongin-si (KR); Sang-Woo Bae, Seoul (KR); Cha-Dong Kim, Cheonan-si (KR); Jung-In Park, Suwon-si (KR)

(73) Assignee: Samsung Display Co., Ltd., Yongin (TW)

( * ) Notice: Subject to any disclaimer, the term of this patent is extended or adjusted under 35 U.S.C. 154(b) by 490 days.

(21) Appl. No.: 12/902,745

(22) Filed: Oct. 12, 2010

(65) Prior Publication Data

US 2011/0199620 A1    Aug. 18, 2011

(30) Foreign Application Priority Data

Feb. 18, 2010   (KR) ........................ 10-2010-0014430

(51) Int. Cl.
- *G01B 11/14* (2006.01)
- *G03B 27/32* (2006.01)
- *G03F 9/00* (2006.01)
- *G03C 5/00* (2006.01)

(52) U.S. Cl.
USPC .............. 356/625; 356/614; 355/77; 430/22; 430/30

(58) Field of Classification Search
None
See application file for complete search history.

(56) References Cited

U.S. PATENT DOCUMENTS

| | | | |
|---|---|---|---|
| 5,985,496 A * | 11/1999 | Nara et al. | 430/30 |
| 6,876,440 B1 * | 4/2005 | Bleeker et al. | 355/77 |
| 7,126,672 B2 * | 10/2006 | Tinnemans et al. | 355/67 |
| 7,317,510 B2 * | 1/2008 | Bontekoe et al. | 355/67 |
| 7,477,403 B2 * | 1/2009 | Gui et al. | 356/614 |
| 7,956,984 B2 * | 6/2011 | Tanaka et al. | 355/53 |
| 2001/0052966 A1 * | 12/2001 | Fujitsuka et al. | 355/53 |
| 2005/0157286 A1 * | 7/2005 | Sasaki | 355/71 |
| 2012/0105865 A1 * | 5/2012 | Patra | 356/601 |

FOREIGN PATENT DOCUMENTS

| | | | |
|---|---|---|---|
| EP | 1375146 A1 * | 1/2004 | |
| JP | 10193675 A * | 7/1998 | |

* cited by examiner

*Primary Examiner* — Gordon J Stock, Jr.
(74) *Attorney, Agent, or Firm* — H.C. Park & Associates, PLC

(57) ABSTRACT

An apparatus and a method for determining an overlap distance of an optical head is disclosed. Positions and light amount distributions of each light spot can be measured, which may be provided from an optical head to a substrate. Gaussian distribution may be applied to the positions and the light amount distributions to calculate a compensation model of each of the light spots. A first accumulated light amount corresponding to each first area of the substrate may be calculated if the optical head is scanning along a first direction of the substrate using the compensation model. A second accumulated light amount corresponding to each second area overlapped with the each first area is calculated if the optical head is scanning along the first direction, which is moved in a second direction by a first distance using the compensation model. An overlap distance may be determined based on a uniformity of summations of the first and second accumulated light amount.

19 Claims, 10 Drawing Sheets

METHOD OF DETERMINING AN OVERLAP DISTANCE OF AN OPTICAL HEAD AND DIGITAL EXPOSURE DEVICE USING THE METHOD

CROSS-REFERENCE TO RELATED APPLICATION

This application claims priority to and benefit of Korean Patent Application No. 2010-14430, filed on Feb. 18, 2010, which is herein incorporated by reference for all purposes as if fully set forth herein.

BACKGROUND OF THE INVENTION

1. Field of the Invention

Exemplary embodiments of the present invention relate to an apparatus and a method for determining an overlap distance of an optical head. More particularly, exemplary embodiments of the present invention relate to a digital exposure device and a method for determining an overlap distance of an optical head used for a digital exposure.

2. Description of the Related Art

Generally, in order to form a metal pattern of a thin-film transistor ("TFT") by using a metal layer and a photoresist layer which may be sequentially formed in a substrate, the metal pattern may be formed using a mask having a design of a metal pattern which may be disposed on the photoresist layer. For example, the photoresist layer can be exposed and developed by providing light to an upper portion of the mask to form a photoresist pattern in which the design of the mask may be reflected. The metal layer can be etched by using the photoresist pattern serving as an etch stop layer so that the metal pattern may be formed. However, when a display substrate includes a plurality of metal patterns, a plurality of masks by the number of the metal patterns may be required due to different patterns. Moreover, when the designs of the metal patterns are changed, the design of the mask may also be required to be changed so that a mask may be re-produced. Since a reproduction cost of the mask is relatively high, reproducing the mask may increase the manufacturing cost of a display substrate.

In order to overcome the problem, an approach has been introduced to an exposure device capable of providing a substrate with beams without using a mask. In the exposure device, the beams may be activated or inactivated to selectively be provided to the substrate so that photoresist patterns dependent on a shape can be defined by the activation or inactivation of the beams. Since an area covered by light provided from the exposure device is limited, the exposure device or the substrate is moved to scan in several times when a photoresist pattern is formed on a large-sized substrate by using the exposure device. In this way, the substrate may fully be exposed by the exposure device.

However, when the substrate is scanned by the exposure device, an overlapped area may be generated. In this approach, the overlapped area of the substrate can be exposed by the exposure device at least more than two times so that unnecessary exposures in terms of generating patterns can not only be a burden to manufacturing a display substrate but adversely affect a manufacturing yield since a uniformity of the photoresist pattern may be decreased.

SUMMARY OF THE INVENTION

Exemplary embodiments of the present invention provide an apparatus and a method for determining an overlap distance of an optical head capable of uniformizing an overlapped area.

Exemplary embodiments of the present invention provide a digital exposure device to determine an overlap distance of an optical head.

Additional features of the invention will be set forth in the description which follows, and in part will be apparent from the description, or may be learned by practice of the invention.

Exemplary embodiments of the present invention disclose a method for determining an overlap distance for direct patterning using an optical lithography. The method includes detecting light amount distributions and positions of each light spot generated from an optical head to a substrate, the substrate comprising a first area and a second area. The method also includes generating a compensation model of each of the light spots by applying a Gaussian distribution function to the respective positions of the light spots and light amount distributions of the light spots. The method includes calculating a first accumulated light amount corresponding to each light spot of the first area of the substrate, the optical head being first scanned along a first direction of the substrate using the compensation model. The method also includes calculating a second accumulated light amount corresponding to each light spot of the second area overlapped with the first area, the overlap area being occurred when the optical head second scanned along the first direction after being moved in a second direction by a first distance using the compensation model. The method includes determining an overlap distance according to a uniformity of the summation of the first accumulated light amount and the second accumulated light amount.

Exemplary embodiments of the present invention disclose an optical device. The optical device includes an optical head comprising a light modulation element to convert light into light comprising plural light paths, the optical head to generate a plurality of laser beams to a substrate by using the light modulation element. The optical device also includes a measuring part to detect positions and light amount distribution of each of light spots incident on a substrate. The optical device includes a calculating part to calculate a compensation model of each of the light spots by applying Gaussian distribution to the detected positions and the light amount distributions. The calculating part is configured to calculate a first accumulated light amount corresponding to the respective positions of the first area of the substrate when the optical head is scanned along a first direction of the substrate using the compensation model. The calculating part is also configured to calculate a second accumulated light amount corresponding to the respective positions of the second area overlapped with positions of the first area. The overlapped area is occurred when the optical head is second scanned along the first direction after being moved in a second direction by a first distance using the compensation model. An overlap distance is determined according to a uniformity of summations of the first accumulated light amounts and the second accumulated light amounts.

Exemplary embodiments of the present invention disclose an apparatus. The apparatus includes a compensation part configured to detect an overlap area in a direct patterning using an optical lithography to compensate errors associated with the overlap area. The overlap area is determined by measuring positions and light amount of each light spot distributed on a substrate and the distribution is calculated by applying a Gaussian distribution to the measured positions and light amount distribution. The substrate comprises a first area comprising a plurality of sectors and a second area comprising a plurality of sectors, and a first accumulated amount is measured corresponding to the respective sectors of the first area in response to detection of a optical head scanning in a first direction and a second accumulated amount is measured corresponding to the respective sectors of the second area overlapped with the sectors of the first area in response to detection of a optical head is second scanned in the first direction after being moved in a second direction by a first distance. A control part is configured to control of a mirror arranged in matrix, the control being associated with selectively activating and inactivating light incidence on the substrate. The mirror is controlled by the overlap area and the overlap area is determined according to a uniformity of the summation of the first accumulated light amount and the second accumulated light amount.

Exemplary embodiments of the present invention disclose a method. The method includes detecting light amount distribution and each position of light spots generated from an optical head for direct patterning on a substrate, the light spots comprising a first area and a second area. The method also includes determining a first accumulated light amount corresponding to each light spot of the first area of the substrate, the optical head being scanned along a first direction of the substrate using a compensation model, wherein the compensation model is provided by applying Gaussian distribution function to the respective positions of the light spots and the light amount distributions. The method also includes determining, using the compensation model, a second accumulated light amount corresponding to each light spot of the second area overlapped with the first area the overlap area being occurred if the optical head is second scanned along the first direction after being moved in a second direction by a first distance. The method also includes controlling a stepping distance of the optical head to generate uniform light incidence with respect to the overlap area based on the determination of the first and second accumulated light amount.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF ILLUSTRATED EMBODIMENTS

Figure 1:
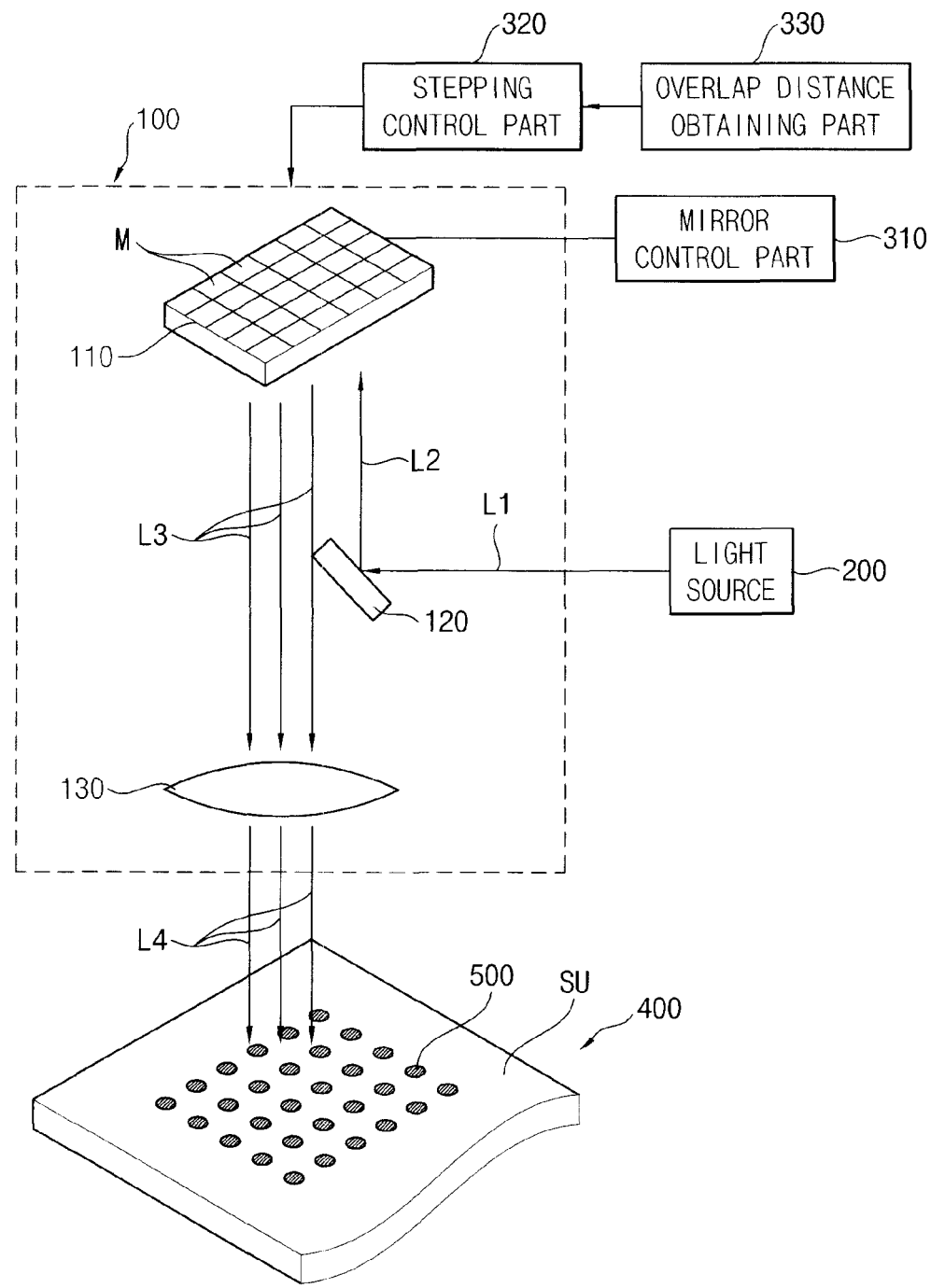
FIG. 1 is a diagram of a digital exposure device capable of determining an overlap distance of an optical head according to exemplary embodiments of the present invention.

Advantages and features of the present invention can be understood more readily by reference to the following detailed description of exemplary embodiments and the accompanying drawings. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It is understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It is understood that although numerical terms such as a first, a second, and a third may be used herein to describe various elements, components, regions, layers and/or sections, these elements, components, regions, layers and/or sections should not be limited by these numerical terms. These terms may only be used to distinguish one element, component, region, layer or section from another region, layer or section. Thus, an element, a component, a region, a layer or a section designated as "first" discussed below may be construed an element, a component, a region, a layer or a section designated as "second" without departing from the teachings of the present invention.

It is understood that terms related to spatially relative terms such as "beneath," "below," "lower," "above," "upper" may be used herein for easy understanding of illustration of one element or feature's relationship to another element(s) or feature(s) as illustrated in the figures. It is understood that the spatially relative terms may be intended to encompass different orientations of the device in use or operation in addition to the orientation depicted in the figures. For example, if the device in the figures is turned over, elements described as "below" or "beneath" other elements or features may be oriented "above" the other elements or features. Thus, the exemplary term "below" may encompass both an orientation of above and below. According to an exemplary configuration, a device may be otherwise oriented to a direction (e.g., rotated 90 degrees or at other orientations) and the spatially relative terms used herein associated with other elements and/or features may be interpreted accordingly.

The terminology used herein is for the purpose of describing exemplary embodiments only and may not be intended to be limiting of the present invention. As used herein, the singular forms "a," "an" and "the" are intended to include the plural forms as well, unless the context clearly indicates otherwise. It is further understood that the terms "comprises"

and/or "comprising," when used in this specification, specify the presence of stated features, integers, steps, operations, elements, and/or components, but these terms do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the present invention. As such, various exemplary embodiments are illustrated by way of examples, and not by way of limitation, for example, variations due to manufacturing techniques and/or tolerances may be expected. Thus, illustrated exemplary embodiments of the present invention should not be construed as limited to the particular shapes of regions illustrated herein but may be construed to include deviations in shapes that may be resulted from manufacturing configurations. For example, an implanted region illustrated as a rectangular shape may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are illustrative in nature and their shapes are not intended to restrict the actual shape of a region of a device and are not intended to limit the scope of the present invention.

Unless otherwise defined, all terms (including technical and scientific terms) used herein have the similar meanings as commonly understood by one of ordinary skill in the art to which this invention belongs. It is further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention are explained in detail with reference to the accompanying drawings.

FIG. 1 is a diagram of a digital exposure device capable of determining an overlap distance of an optical head according to exemplary embodiments of the present invention.

Referring to FIG. 1, the digital exposure device may include an optical head 100, a light source 200, a mirror control part 310, a stepping control part 320 and an overlap distance obtaining part 330.

The optical head 100 may include a light modulating element 110, a splitter 120 and an optical system 130. The optical head 100 may be connected to the light source 200, the mirror control part 310 and the stepping control part 320. In this example, the light modulating element may include a digital micro-mirror device ("DMD") 110.

The light source 200 may be connected to the splitter 120 to provide the splitter 120 with a first light L1 emitted from the light source 200. The splitter 120 can receive the first light L1 to provide a second light L2 to the DMD 110 by converting a path of the first light L1.

The DMD 110 may reflect the second light L2 to emit a plurality of third lights L3 onto the optical system 130. For example, the DMD 110 may include a plurality of micro-mirrors M. The micro-mirrors M may be arranged in an 'm×n' matrix. Each of the 'm×n' micro-mirrors M may reflect the second light L2 to provide the optical system 130 with 'm×n' third lights L3. The DMD 110 may selectively reflect the second light L2 onto a substrate SU which may be disposed on a stage 400 based on an image data which can be transferred thereto.

The mirror control part 310 may activate or inactivate each of the micro-mirrors M based on the image data. The mirror control part 310 can output a signal controlling an activation or inactivation of the micro-mirrors M to each of the micro-mirrors M. When the micro-mirrors M receive an activation data from the mirror control part 310, each of the micro-mirrors M may reflect the second light L2 onto the optical system 130. When portions of the micro-mirrors M receive an activation data from the mirror control part 310, corresponding micro-mirrors reflect the second light L2 onto the optical system 130. When the remaining micro-mirrors M receive an inactivation data from the mirror control part 310, the remaining micro-mirrors M do not reflect the second light L2.

In some examples, the optical system 130 may include a plurality of lenses. The optical system 130 may condense the third lights L3 provided from the DMD 110, and may emit a fourth light L4 onto the stage 400 by adjusting a resolution of the condensed lights. The fourth lights L4 may correspond to a plurality of laser beams which is provided to the stage 400 by the optical head 100. When the 'm×n' micro-mirrors M receive an activation data from the mirror control part 310, the number of laser beams can be 'm×n.' When portions of the 'm×n' micro-mirrors M receive an activation data from the mirror control part 310 and the remaining of the 'm×n' micro-mirrors M receives an inactivation data from the mirror control part 310, the number of laser beams may substantially be equal to the number of activated micro-mirrors M.

For example, the laser beams may be provided on the substrate SU disposed on the stage 400 as a plurality of light spots 500. In this example, the light spots 500 may be defined as an exposure area on which the laser beams are actually irradiated. When all of the micro-mirrors M receive an activation data from the mirror control part 310, the substrate SU receives 'm×n' light spots 500 being substantially equal to the number of micro-mirrors M.

Since the DMD 110 is arranged in an 'm×n' matrix, the optical head 100 may provide the substrate SU with the light spots 500 of an 'm×n' matrix at a state that the optical head 100 and the stage 400 are stopped. In this example, at a state that the optical head 100 and the stage 400 are stopped, an area of the substrate SU between the light spots 500 adjacent to each other may be a non-exposure area where the laser beam may not be provided thereto.

Figure 2:
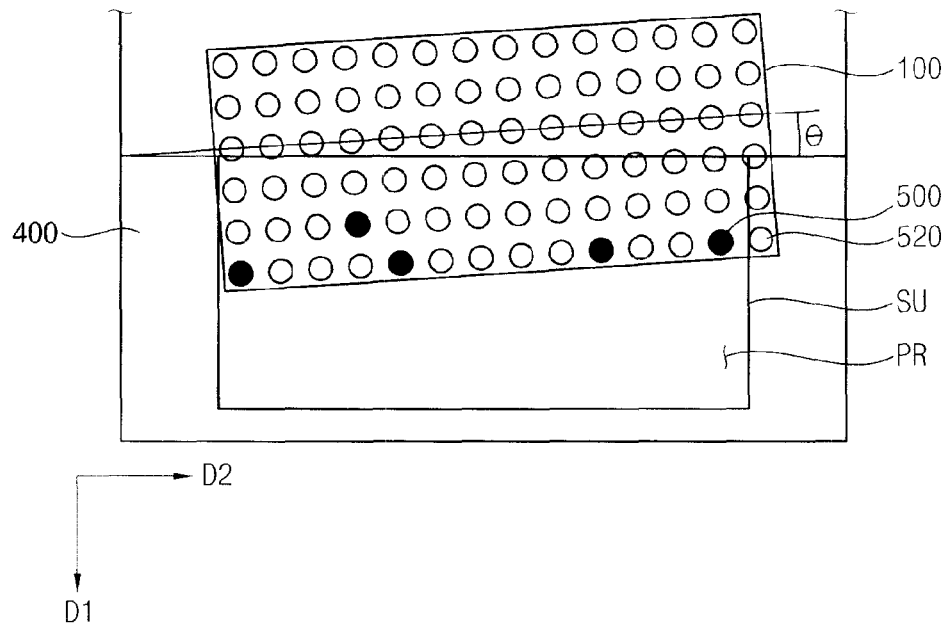
FIG. 2 is a diagram showing an exposure of a substrate by using an optical head of FIG. 1.

FIG. 2 is a diagram showing an exposure of a substrate by using an optical head of FIG. 1.

Referring to FIG. 2, portions of the micro-mirrors M may receive an activation data from the mirror control part 310, and the remaining of the micro-mirrors M may receive an inactivation data from the mirror control part 310. Thus, the substrate SU can receive the light spots as many as the number of micro-mirrors M corresponding to the activation data. Therefore, a predetermined area of the substrate SU may selectively be exposed without a mask having a design of the image data between the optical head 100 and the substrate SU.

In some examples, the micro-mirrors M receiving the inactivation data may not provide the substrate SU with light. However, in order to show a relationship between the micro-mirrors M receiving the activation data and the micro-mirrors M receiving the inactivation data, and a position of the micro-mirrors M receiving the inactivation data, the micro-mirrors M receiving the inactivation data are denoted as "a virtual spot," and a "virtual spot" represented by a reference numeral "520." Moreover, exposing the substrate SU using the optical head 100 is for exposing a photoresist payer PR formed on the substrate SU. Hereinafter, the term "an exposure of a substrate" may include the term "an exposure of a photoresist layer."

As the stage 400 is moved in a first direction D1, the substrate SU disposed on the stage 400 may be scanned by the optical head 100. The angle of incline of optical head 100 disposed on the stage 400 may be at a predetermined angle 'θ' with respect to the substrate SU. As the stage 400 is moved in the first direction D1, the substrate SU may be exposed by the optical head 100. For example, if all of the 'm×n' micro-mirrors M receive an activation data to provide the substrate SU with a plurality of light spots 500 as shown in FIG. 1, the stage 400 may be moved in the first direction D1 at a state that the stage 400 may be inclined with respect to the optical head 100 so that the substrate SU may be exposed by the optical head 100.

For example, as the stage 400 is moved in the first direction D1 with respect to a straight line area along a straight line extended in the second direction D2 of the substrate SU, the straight line area may sequentially receive light spots 500 provided by the micro-mirrors M of a first row, light spots 500 provided by the micro-mirrors M of a second row, and light spots 500 provided by the micro-mirrors M of a third row. Lastly, the 'm×n' light spots 500 overlapped along the second direction D2 may be irradiated into the straight line area. Thus, if an entire area of the substrate SU is divided into a plurality of straight line areas, the 'm×n' light spots 500 may be irradiated onto each of the straight line areas. The 'm×n' micro-mirrors M can provide light spots 500 spaced apart from each other to the substrate SU. However, since the stage 400 is moved in an inclined state in which the optical head 100 is inclined with respect to the stage 400 by a predetermined angle, the substrate SU corresponding to a scanned area of the optical head 100 may be exposed by the optical head 100 without an area where the substrate may not be exposed.

When the optical head 100 irradiates lights onto the substrate SU in a state that the optical head 100 is not inclined with respect to the stage 400, for example, the optical head 100 is inclined by a predetermined angle "θ" less than about 0.1 with respect to the stage 400, lights may be not irradiated to areas of the substrate SU corresponding to an area between the light spots 500 adjacent to each other even though the optical head 100 is moved in the first direction D1. In this example, a continuous line pattern or a continuous area may not be exposed. In some examples, if a predetermined angle "θ" is more than about 0.5, a distance between the light spots 500 provided by the micro-mirrors M of the first row and the light spots 500 provided by the micro-mirrors M of the second row may be increased at a straight line area of the stage 400. Thus, pattern quality such as a line edge roughness ("LER") may be deteriorated. Therefore, in order to provide a light amount of an optimum level to the whole substrate SU by using the optical head 100, the predetermined angle "θ" may be, for example, no less than about 0.1 to no more than about 0.5. (e.g., $0.1 < \theta < 0.5$)

The image data may determine a coordinate of an area which may be exposed on the substrate SU. The image data may be reflected to active or inactive data of the micro-mirrors M. Thus, if the micro-mirrors M corresponding to a coordinate of the substrate SU are matched to the coordinate while the substrate SU is moved in the first direction D1, the micro-mirrors M may receive an activation data to provide the light spot 500 to the substrate SU. Since the micro-mirror M which does not correspond to the coordinate receives an inactivation data, the substrate SU can only receive the virtual spot 520. Thus, the substrate SU corresponding to an area on which the micro-mirrors M receiving the inactivation data is scanned may not be exposed. For example, a predetermined area of the substrate SU may selectively be exposed without a mask having a design in which the image data may be reflected between the optical head 100 and the substrate SU.

Referring again to FIG. 1, the stepping control part 320 may be connected to the optical head 100 to move the optical head 100 in one direction. Since a width of the optical head 100 is limited, lights may be not provided to an entire surface of the substrate SU by using one optical head 100. Thus, the substrate SU may be divided into a plurality of unit areas which are extended in the first direction D1 and are arranged in the second direction D2, and the substrate SU is scanned for plural times by using the optical head 100. For example, the optical head 100 may firstly scan a first unit area A1 (refer to FIG. 7A) of the substrate SU, and then secondly scan a second unit area A2 (refer to FIG. 7A) adjacent to the first unit area A1 after the optical head 100 is moved in the second direction D2. In this example, the stepping control part 320 may control that the optical head 100 is moved by a predetermined interval in the second direction D2. A movement of the optical head 100 in the second direction D2 with respect to the substrate SU can be defined as "a stepping," and a predetermined interval by which the optical head 100 is moved can be defined as "a stepping distance."

The overlap distance obtaining part 330 may determine an overlapped area A3 (refer to FIG. 7A) of the substrate SU and an overlap distance that is a width of the overlapped area A3. Since the optical head 100 firstly and secondly scans the substrate SU in a state in which the substrate SU is inclined with the optical head 100 by a predetermined angle, a boundary area between the first unit area A1 and the second unit area A2 is an area that can be formed to be exposed without a non-exposed area. The stepping distance may be determined based on the overlapped area A3 and the overlap distance. The overlap distance obtaining part 330, the overlapped area A2 and the overlap distance will be described below in detail with reference to FIG. 3, FIG. 6, FIG. 7A, FIG. 7B and FIG. 7C.

Figure 3:
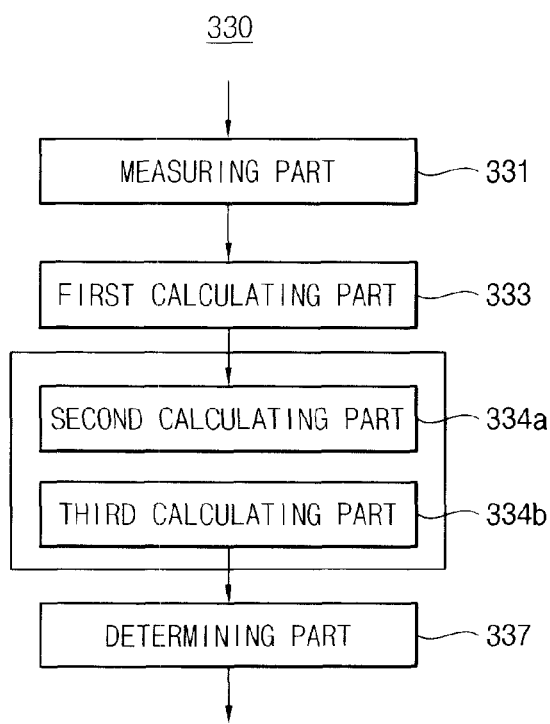
FIG. 3 is a flowchart of a process for determining an overlap distance by the obtaining part of FIG. 1.

FIG. 3 is a flowchart of a process for determining an overlap distance obtaining part of FIG. 1.

Referring to FIG. 3, the overlap distance obtaining part 330 may include a measuring part 331, a first calculating part 333, a second calculating part 334a, a third calculating part 334b and a determining part 337.

The measuring part 331 may measure a position and a light amount distribution of each of the light spots 500 provided to substrate SU from the optical head 100.

In some examples, the micro-mirrors M of the optical head 100 are theoretically designed to have an 'm×n' square matrix, but alternative exemplary embodiments may be implemented. For example, a matrix forming the micro-mirrors M may not be a perfect square shape. Moreover, the substrate SU may not receive a light spot having a shape identical to the laser beam. A refraction of a light spot can be generated due to air generated in a process that the laser beam irradiated from the optical head 100 is reached to the substrate SU so that the positions and light amount distributions of ideal light spots and the positions and light amount distributions of the light spots 500 actually being measured may be different from each other. The measuring part 331 may measure the position and light amount distribution of the light spots 500 so that the overlap distance obtaining part 330 may reflect the position and light amount distribution of the light spots 500 to determine the overlap distance. For example, the measuring part 331 may include an optical sensor disposed on the substrate SU.

The first calculating part 333 may use Gaussian distribution function to the position and light amount distribution of the light spots 500 measured by the measuring part 331 to calculate compensation models of each of the light spots 500.

The second calculating part 334a may calculate a first accumulated light amount corresponding to each of first sub-areas of the substrate SU if the optical head 100 is scanned in the first direction D1 by using the compensation model. For example, the first accumulated light amount may be calculated based on the compensation model obtained by the first calculating part 334a not based on actually performing an exposure process to the substrate SU by using the optical head 100.

The third calculating part 334b may calculate a second accumulated light amount corresponding to each of second sub-areas including second areas D21, D22 and D23 (refer to FIG. 7C) corresponding to first areas D11, D12 and D13 (refer to FIG. 7C) of the first sub-areas if the optical head 100 moved by about first distance in the second direction D2 by using the compensation model is scanned along the first direction D1. The second accumulated light amount may be calculated based on the compensation model obtained by the first calculating part 334a not a calculation by actually performing an exposure process.

The determining part 337 may determine the overlap distance in accordance with a uniformity of summations of the second accumulated light amounts respectively corresponding to the second areas D21, D22 and D23 and the first accumulated light amounts respectively corresponding to the first areas D11, D12 and D13 respectively being overlapped with the second areas D21, D22 and D23. When the overlap distance is determined, the stepping distance may be determined by a moving distance of the optical head 100 if the overlap distance is calculated. If the summations of the first accumulated light and the second accumulated light are determined as uniform, the overlap distance can be determined. If the summations are determined as non-uniform, the optical head 100 may be moved by a second distance to calculate an accumulated light amount by the third calculating part 334b with respect to another overlapped area, and then the determining part 337 may determine whether the summations are uniform or non-uniform to determine the overlap distance.

Hereinafter, referring to FIG. 4A, FIG. 4B and FIG. 5, for example, it may be described that a position and a light amount distribution of the light spots are measured by the measuring part 331 and the first calculating part 333, and Gaussian distribution function is applied to the position and the light amount distribution to calculate the compensation model.

Figure 4A:
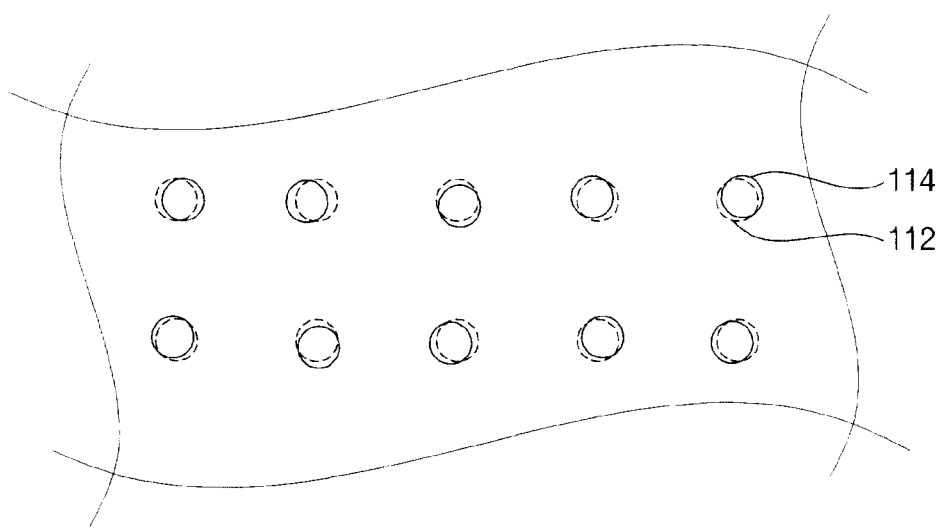
FIG. 4A is diagram showing a position of a light spot of FIG. 1.
Figure 4B:
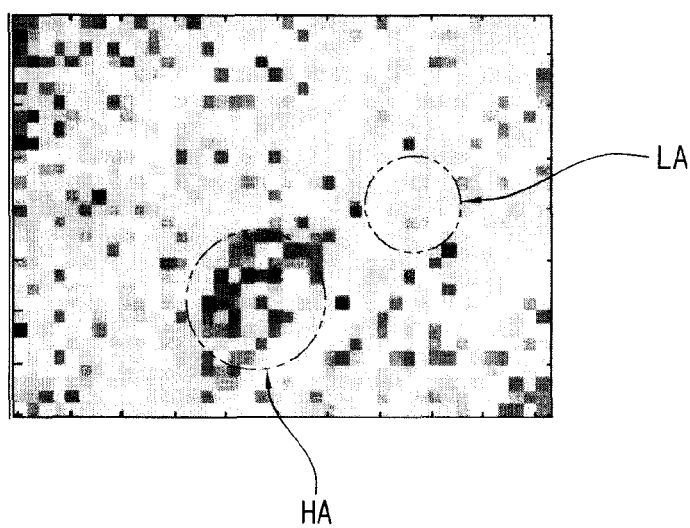
FIG. 4B is a diagram showing a light amount distribution of the light spot of FIG. 1.

FIG. 4A is a diagram showing a position of a light spot of FIG. 1, and FIG. 4B is a diagram showing a light amount distribution of the light spot of FIG. 1.

Referring to FIG. 4A, an ideal light spot may be disposed at a first position 112 on the substrate SU. However, actual light spots 500 may be positioned at a second position 114 which is not matched to the first position 112 on the substrate SU. Thus, the overlap distance obtaining part 330 can measure the second position 114 that is an actual position of the light spots 500.

Referring to FIG. 4B, a light amount distribution of one of the light spots 500 is described. Since the light spots 500 have the different light amounts by areas of the light spots 500, the light amount distribution may not be uniform in a single light spot 500. For example, the light spot 500 may be classified into a high area HA in which an energy is condensed to have a high energy and a low area 'LA' which has a lower energy than the high area 'HA.' As described above, in one light spot 500, light amount distributions may be different from one another in accordance with areas, and light amount distributions of the different light spots 500 may be different from one another. Thus, the measuring part 331 may measure an actual light amount distribution of the light spots 500.

Figure 5:
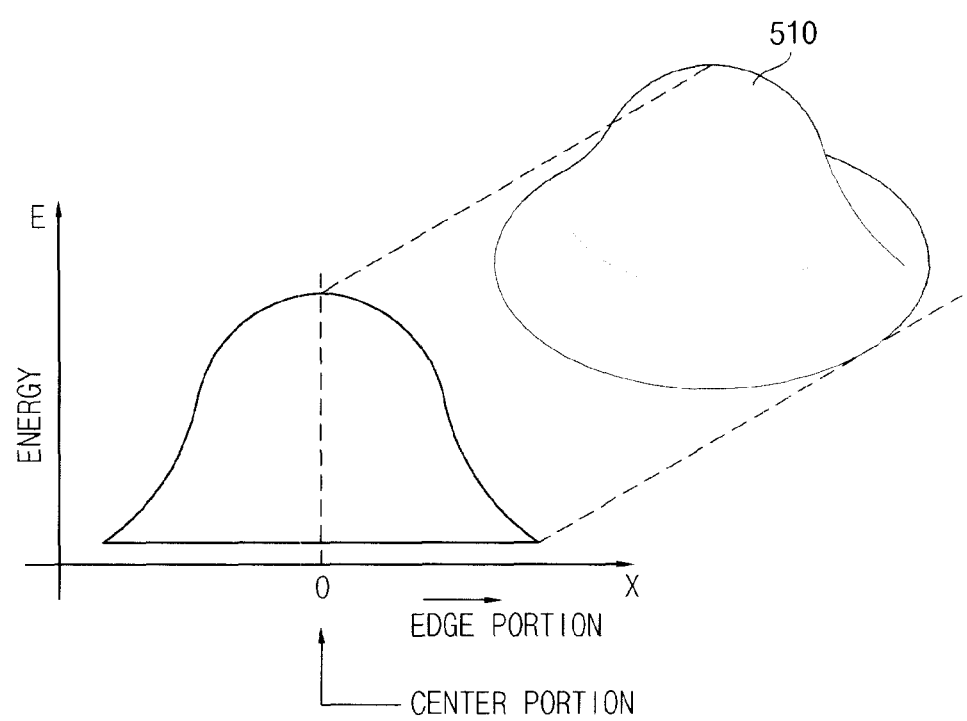
FIG. 5 is a diagram illustrating Gaussian distribution function of a light spot provided to a substrate by the optical head of FIG. 1.

FIG. 5 is a diagram illustrating Gaussian distribution function of a light spot provided to a substrate by the optical head of FIG. 1.

Referring to FIG. 5, the light spots 500 may have a bell shape 510 in a three-dimension. For example, a cross-sectional view of the light spots 500 may depict Gaussian distribution function. An energy may be the highest in a center portion of the light spots 500, and the energy may gradually be decreased as it goes further away from the center portion thereof to be closer toward an edge portion thereof. At an area which is scanned for once by the optical head 100, the light spots 500 may be overlapped through the scanning process so that total summations of the light amounts corresponding to the scanned area may be determined. The Gaussian distribution function may be applied to a position and a light amount distribution of the light spots 500 so that each compensation model of the light spots 500 may be calculated. Thus, the compensation model may have a similar shape with an actual light spot 500.

Hereinafter, it is explained a driving method of the overlap distance obtaining part with reference to FIG. 6, and it is explained a method of determining the overlap distance at the overlap distance obtaining part with reference to FIG. 7A, FIG. 7B and FIG. 7C.

Figure 6:
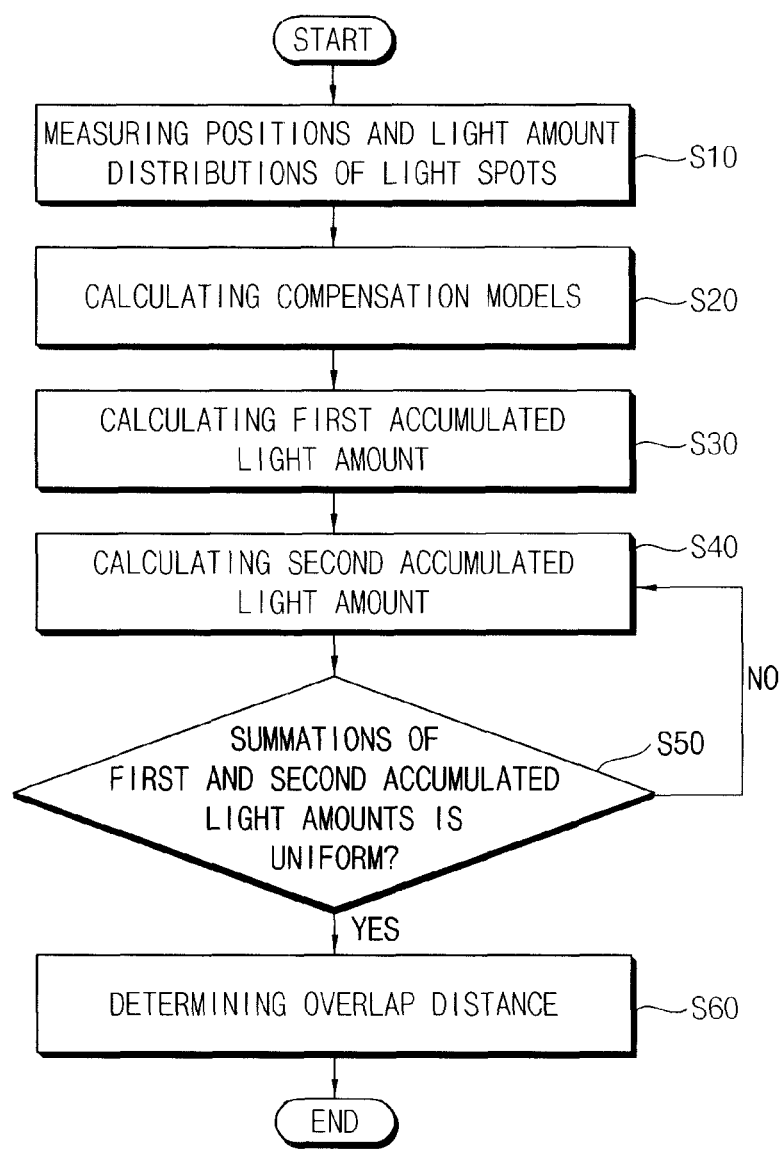
FIG. 6 is a flow chart of a process for measuring and calculating light amount associated with a driving method of the overlap distance obtaining part of FIG. 3.

FIG. 6 is a flow chart of a process for measuring and calculating light amount associated with a driving method of the overlap distance obtaining part of FIG. 3.

Referring to FIG. 6, before the substrate SU is exposed by the digital exposure device of FIG. 1, in step S10, positions and light amount distribution of each of the light spots 500 may be measured. The measuring of the positions and light amount distribution may be performed by the measuring part 331 of the digital exposure device.

In step S20, Gaussian distribution function is applied to the position and the light amount distribution to calculate compensation models of each of the light spots 500.

A first accumulated light amount respectively corresponding to each first area of the substrate may be calculated in a case where the optical head is scanned along a first direction of the substrate SU using the compensation model, per step S30.

A second accumulated light amount respectively corresponding to each second area overlapped with the first area may be calculated in a case where the optical head is scanned along the first direction, which is moved in a second direction by a first distance using the compensation model, per step S40.

As in step S50, it is checked whether total summations of the first accumulated light amounts and the second accumulated light amounts are uniform or non-uniform. If the summations of the first and second accumulated light amounts are determined as non-uniform according to the step S50, it is feed back to the step S40. Alternatively, if the summations of the first and second accumulated light amounts are determined as uniform according to the step S50, an overlap distance may be determined, per step S60.

For example, in the step S50, if the summations of the first and second accumulated light amounts are determined as uniform, a width of the overlapped area along the second direction D2 may be determined as the overlap distance. The first distance may be determined as the stepping distance. Alternatively, in the step S50, if the summations of the first and second accumulated light amounts are determined as non-uniform, a third accumulated light amount can be calculated, the third accumulated light amount respectively corresponding to the third areas being overlapped with the first areas if the optical head 100 moved by the second distance in the second direction D2 by using the compensation model is scanned along the first direction D1. A width of the third area along the second direction D2 may be determined as the overlap distance in accordance with a uniformity of summations of the third accumulated light amounts of the third areas and the first accumulated light amounts of the first areas respectively being overlapped with the third areas. In this example, the second distance may be determined as the stepping distance.

Figure 7A:
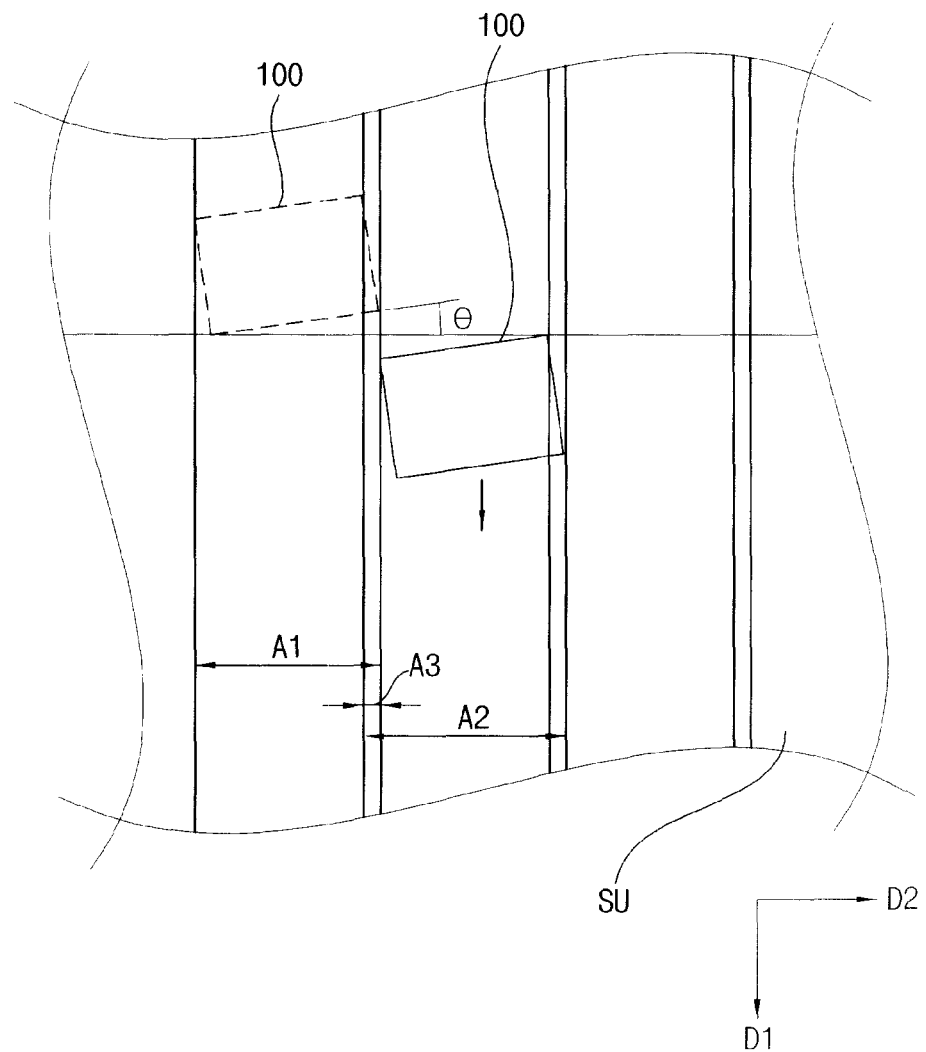
FIG. 7A, FIG. 7B and FIG. 7C are diagrams showing a second calculating part and a third calculating part of FIG. 3.
Figure 7B:
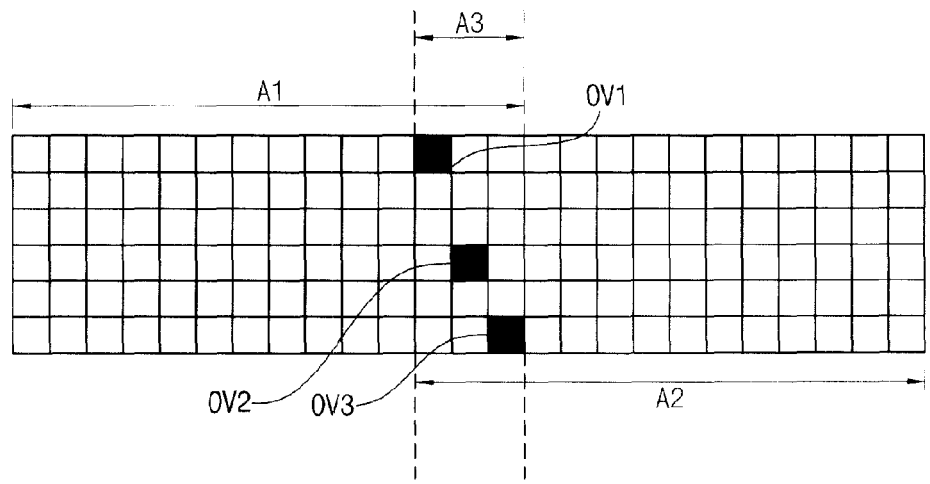
Figure 7C:
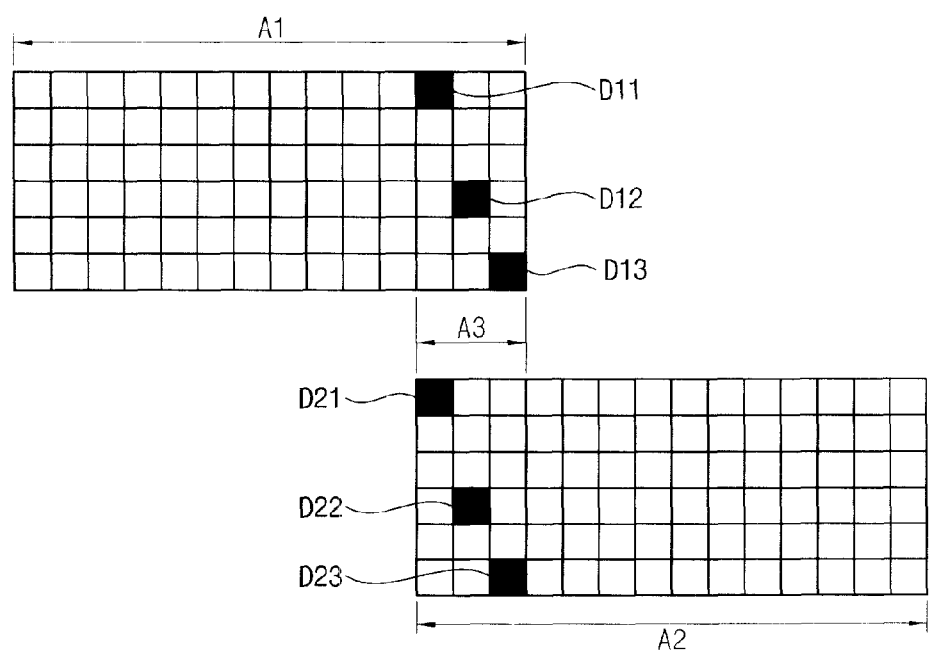

FIG. 7A, FIG. 7B and FIG. 7C are diagrams showing a second calculating part and a third calculating part of FIG. 3.

Referring to FIG. 7A, the second calculating part 334a may calculate a first accumulated light amount at the first unit area A1 if the optical head 100 is moved along the first direction D1 of the substrate SU to expose the first unit area A1.

Moreover, the third calculating part 334b may calculate a second accumulated light amount at the second unit area A2 if the optical head 100 is moved along the second direction D2 of the substrate SU to expose the second unit area A2. The optical head 100 of the step for calculating the second accumulated light amount is defined as the optical head 100 is moved by the first distance along the second distance D1 in comparison with the step for calculating the first accumulated light amount. In this example, the second unit area A2 may partially be overlapped with the first unit area A1. An area in which the first and second unit areas A1 and A2 are overlapped with each other may be defined as the overlapped area A3.

Referring to FIG. 7B, if the first unit area A1 and the second unit area A2 are divided into a plurality of first areas and a plurality of second areas, respectively, the overlapped area A3 may also be divided into a plurality of third areas OV1, OV2 and OV3. The third areas OV1, OV2 and OV3 are areas simultaneously corresponding to the firstly exposed area if the first unit area A1 is exposed and the secondly exposed area if the second unit area A2 is exposed. An accumulated light amount of the third areas OV1, OV2 and OV3 may be substantially equal to a summation of the first accumulated light amount and the second accumulated light amount that are provided to the third areas OV1, OV2 and OV3. For example, if each of the accumulated light amounts of the third areas OV1, OV2 and OV3 is determined as uniform, the determining part 337 may determine the overlapped area A3 as an optimized overlapped area, and may determine a width of the overlapped area A3 along the second direction D2 as the overlap distance.

Referring to FIG. 7C, the firstly exposed areas at the overlapped area A3 may be defined as first sub-areas D11, D12 and D13, and the secondly exposed areas at the overlapped area A3 are defined as second sub-areas D21, D22 and D23. Each of the first sub-areas D11, D12 and D13 may correspond to each of the second sub-areas D21, D22 and D23 in a one-to-one correspondence.

When the compensation model is obtained by the first calculating part 333, the first accumulated light amounts of the first sub-areas D11, D12 and D13 may be respectively calculated. As shown in FIG. 7A, the substrate SU may be moved along the first direction D1 at a state with the optical head 100 being inclined by a predetermined angle 'θ' with respect to the substrate SU so that the first accumulated light amounts of the first sub-areas D11, D12 and D13 may be lower than the first accumulated light amounts of the first areas except the first sub-areas D11, D12 and D13. Moreover, if the compensation model is used, the second accumulated light amounts of the second sub-areas D21, D22 and D23 may respectively be calculated. The second accumulated light amounts of the second sub-areas D21, D22 and D23 may be lower than the second accumulated light amounts of the second areas except the second sub-areas D21, D22 and D23. The overlapped area A3 is exposed twice through a first scanning process and a second scanning process of the optical head 100. Moreover, a portion of the overlapped area A3 which is passed by the optical head 100, if the optical head 100 firstly scans the substrate SU, and a portion of the overlapped area A3 which is passed by the optical head 100, if the optical head 100 secondly scans the substrate SU, are in a symmetrical relationship such as a point-to-point correspondence. Thus, accumulated light amounts at the overlapped area A3 by the first and second scans may substantially be equal to accumulated light amount at each of the first and second sub-areas D11, D12, D13, D21, D22 and D23 of the first unit area A1 and the second unit area A2 except the overlapped area A3.

Based on the above principles, the determining part 337 may calculate a total summation of the first accumulated light amount of the first sub-areas D11, D12 and D13 and the second accumulated light amount of the second sub-areas D21, D22 and D23, and may check whether the total summation is uniform or non-uniform to determine the overlapped area A3 as an ideal overlapped area.

For example, the determining part 337 may calculate a total summation of a first accumulated light amount of a first sub-area displayed as a reference numeral D11 and a second accumulated light amount of a second sub-area displayed as a reference numeral D21 corresponding to the reference numeral D11. In addition, the determining part 337 may calculate a total summation of a first accumulated light amount of a first sub-area displayed as a reference numeral D12 and a second accumulated light amount of a second sub-area displayed as a reference numeral D22 corresponding to the reference numeral D12. In addition, the determining part 337 may calculate a total summation of a first accumulated light amount of a first sub-area displayed as a reference numeral D13 and a second accumulated light amount of a second sub-area displayed as a reference numeral D23 corresponding to the reference numeral D13. The determining part 337 may calculate a total summation of the first accumulated light amount of the first sub-area and the second accumulated light amount of the second sub-area in all areas of the overlapped area A3, and may check whether the total summation is determined as uniform or non-uniform. When the total summation is determined as uniform, the determining part 337 may determine the overlapped area A3 as an ideal overlapped area, and may determine a width of the overlapped area A3 along the second direction D2 as the overlap distance. The first distance may be the stepping distance.

If the total summation is determined as non-uniform, the determining part 337 may calculate the first and second accumulated light amounts by assuming that the optical head 100 is moved by a second distance different from the first distance, and may determine whether the total summation of the first and second accumulated light amounts is uniform or non-uniform at each portion of overlapped areas. By repeatedly performing the above steps, when the total summation is determined as uniform, the determining part 337 may determine the overlapped area and the overlap distance, and an operation of the determining part 337 may be ended.

In some examples, the overlapped area and the overlap distance may be determined by reflecting information on light spots 500 which is actually provided to the substrate SU by the optical head 100. Thus, a substrate of a large size may also uniformly be exposed.

In FIG. 3, it is observed that the overlap distance obtaining part 330 is divided into the second calculating part 334a and the third calculating part 334b. Alternatively, the second calculating part 334a and the third calculating part 334b may be integrated with each other to realize an integrated calculating part (not shown) which calculates the first and second accumulated light amounts. The integrated calculating part may calculate the first and second accumulated light amounts based on the compensation model generated by the calculating part 333, and the determining part 337 may determine the overlap distance based on the first and second accumulated light amounts calculated by the integrated calculating part.

Result of simulation of light amounts is described as follows.

In a digital exposure device in which an exposing head having a size of about '52 mm×52 mm' is inclined by an angle of about 0.3 degrees with respect to a substrate to be scanned, a stepping distance is set as about 52.474178 mm, about 52.444178 mm, about 52.414178 mm and about 52.394178 mm, and an accumulated exposure light amount can be measured at an overlapped area to show the result on FIG. 8A, FIG. 8B, FIG. 8C and FIG. 8D. In FIG. 8A, FIG. 8B, FIG. 8C and FIG. 8D, the x-axis may represent a plurality of areas of the overlapped area, and the y-axis may represent an accumulated exposure light amount at each of the areas. In FIG. 8A, FIG. 8B, FIG. 8C and FIG. 8D, a standard unit of the x-axis is 'μm,' and a standard unit of the y-axis is 'mJ/cm$^2$'.

Figure 8A:
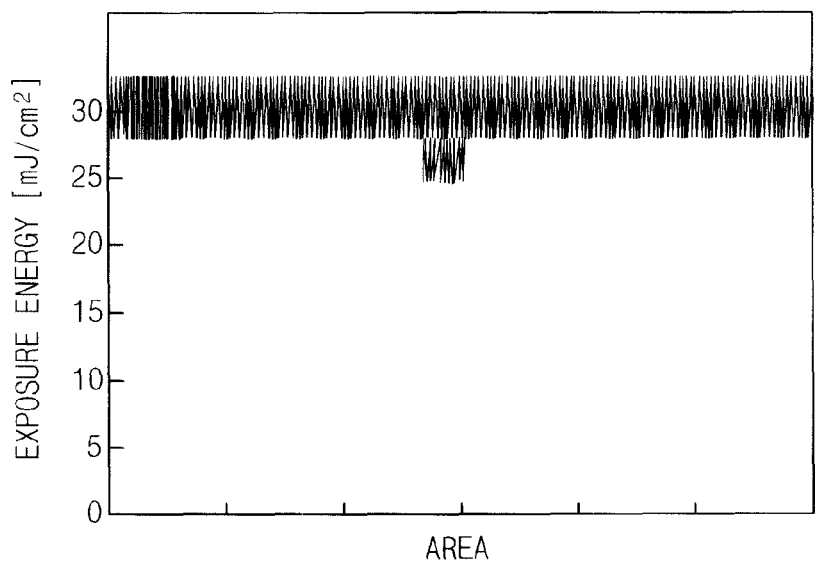
FIG. 8A, FIG. 8B, FIG. 8C and FIG. 8D are graphs illustrating a uniformity of accumulated exposure light amount that is calculated in accordance with exemplary embodiments of the present invention.
Figure 8B:
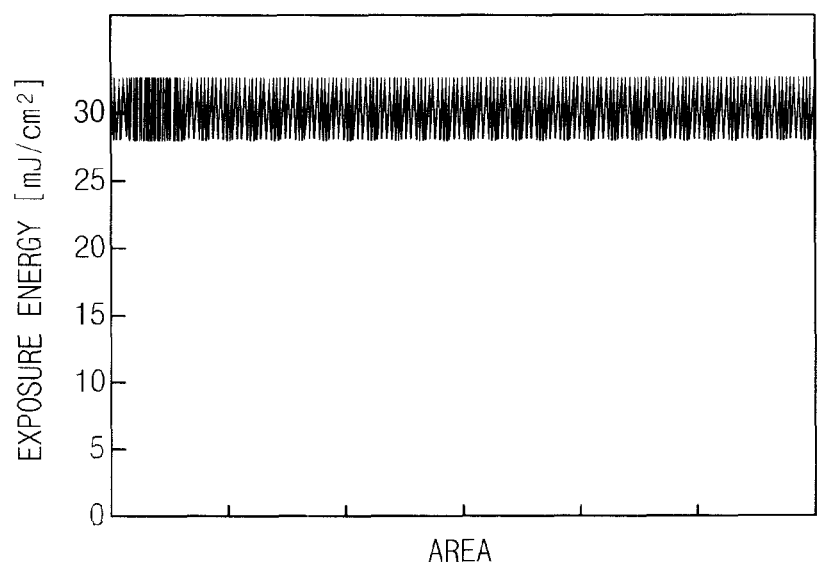
Figure 8C:
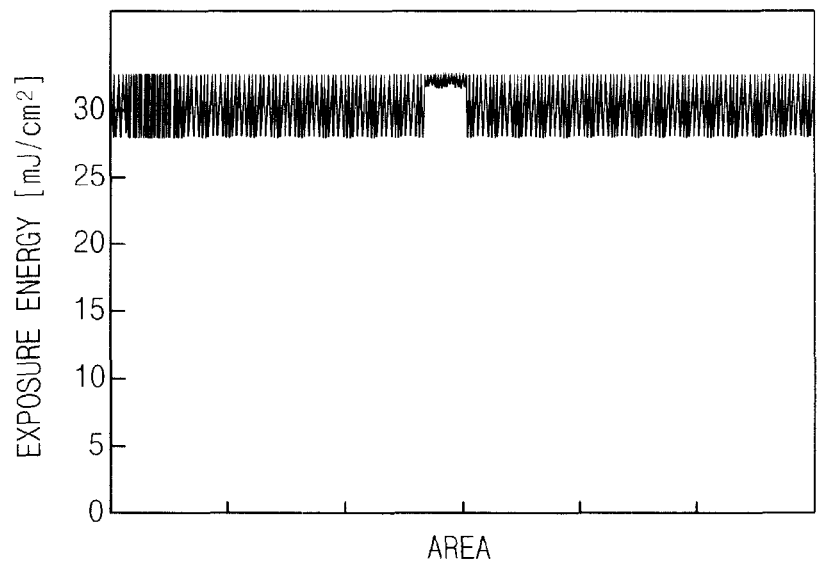
Figure 8D:
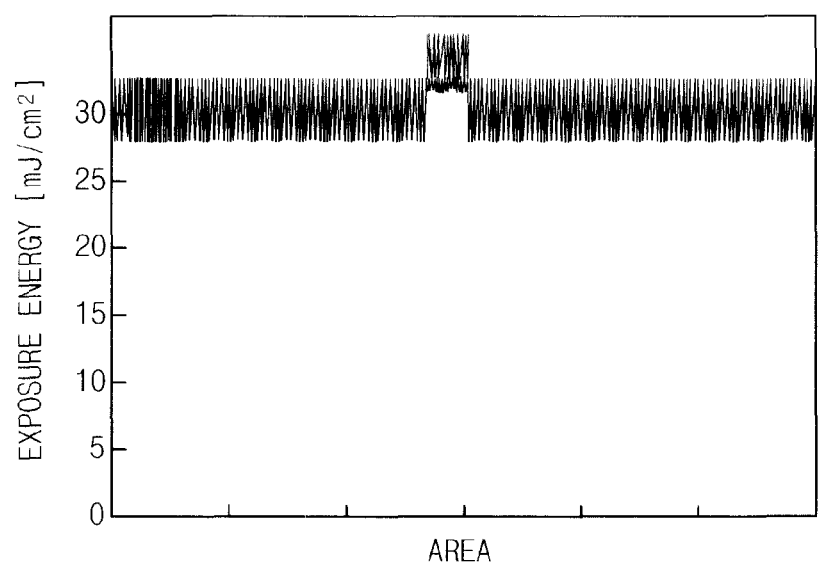

FIG. 8A, FIG. 8B, FIG. 8C and FIG. 8D are graphs illustrating a uniformity of accumulated exposure light amount that is calculated in accordance with exemplary embodiments of the present invention. For example, FIG. 8A shows a relationship between areas and an exposure energy if a stepping distance is about 52.474178 mm, and FIG. 8B shows a relationship between areas and an exposure energy if a stepping distance is about 52.444178 mm. Moreover, FIG. 8C shows a relationship between areas and an exposure energy if a stepping distance is about 52.414178 mm, and FIG. 8D shows a relationship between areas and an exposure energy when a stepping distance is about 52.394178 mm.

Referring to FIG. 8A, an area in which an overlapped area is about 170 μm if the stepping distance is about 52.474178 mm so that it is recognized that an extremely high accumulated exposure light amount is included. Referring to FIG. 8B, an area in which an overlapped area is about 200 μm if the stepping distance is about 52.444178 mm so that it is recognized that a wholly uniformed accumulated exposure light amount is included. Referring to FIG. 8C, an area in which an overlapped area is about 230 μm if the stepping distance is about 52.414178 mm so that it is recognized that an extremely low accumulated exposure light amount is included. Referring to FIG. 8D, an area in which an overlapped area is about 250 μm when the stepping distance is about 52.394178 mm so that it is recognized that an extremely low accumulated exposure light amount is included. As shown in FIG. 8A, FIG. 8B, FIG. 8C and FIG. 8D if a deviation of the overlapped area is about ±5%, it is recognized that the overlapped area may be about 190 μm to about 210 μm.

In some examples, signal wirings having a width of about 0.35 μm may be formed on a substrate of a large size by overlap distances of about 170 μm, about 200 μm, about 230 μm and about 250 μm, respectively, based on the result of simulation of light amounts. If the overlap distance is about 170 μm, portions of the signal wirings may be formed to have a width wider than about 0.35 μm. When the overlap distance is about 230 μm to about 250 μm, portions of the signal wirings may be formed to have a width narrower than about 0.35 μm.

As described above in detail, a stepping distance of an optical head may be determined by reflecting information on light spot which may be provided to a substrate by an optical head emitting plural laser beams. Thus, exposure amounts of an overlapped area in which the optical heads are overlapped with each other to be scanned may be uniform so that a substrate of a large size may be exposed by using the optical head. Moreover, an interval distance between the optical heads may be determined if the substrate is scanned by using an optical assembly including the plurality of optical heads.

One of ordinary skill in the art would recognize that processes for compensating an error using Gaussian distribution and controlling an optical head of an optical lithography may be implemented via software, hardware (e.g., general processor, Digital Signal Processing (DSP) chip, an Application Specific Integrated Circuit (ASIC), Field Programmable Gate Arrays (FPGAs), etc.), firmware, or a combination thereof. Such exemplary hardware for performing the described functions is detailed below with respect to FIG. 9.

Figure 9:
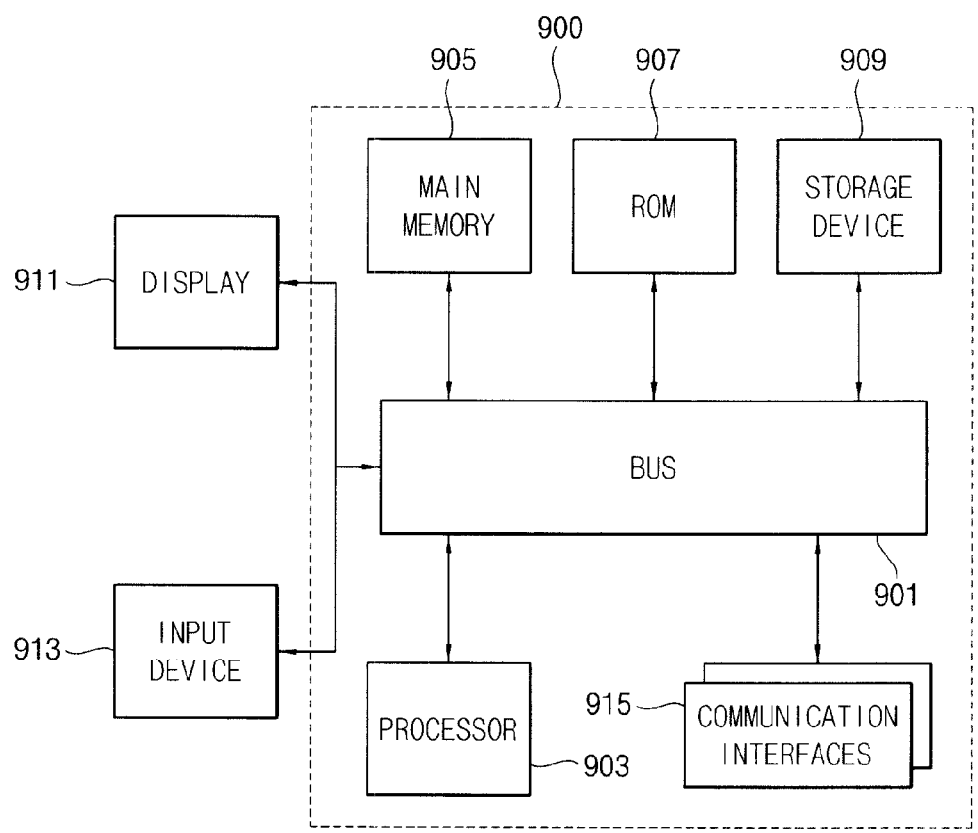
FIG. 9 is a diagram of hardware that can be used to implement various embodiments of the invention

FIG. 9 illustrates exemplary hardware upon which various embodiments of the invention can be implemented. A computing system 900 includes a bus 901 or other communication mechanism for communicating information and a processor 903 coupled to the bus 901 for processing information. The computing system 900 also includes main memory 905, such as a random access memory (RAM) or other dynamic storage device, coupled to the bus 901 for storing information and instructions to be executed by the processor 903. Main memory 905 can also be used for storing temporary variables or other intermediate information during execution of instructions by the processor 903. The computing system 900 may further include a read only memory (ROM) 907 or other static storage device coupled to the bus 901 for storing static information and instructions for the processor 903. A storage device 909, such as a magnetic disk or optical disk, is coupled to the bus 901 for persistently storing information and instructions.

The computing system 900 may be coupled with the bus 901 to a display 911, such as a liquid crystal display, or active matrix display, for displaying information to a user. An input device 913, such as a keyboard including alphanumeric and other keys, may be coupled to the bus 901 for communicating information and command selections to the processor 903. The input device 913 can include a cursor control, such as a mouse, a trackball, or cursor direction keys, for communicating direction information and command selections to the processor 903 and for controlling cursor movement on the display 911.

According to various embodiments of the invention, the processes described herein can be provided by the computing system 900 in response to the processor 903 executing an arrangement of instructions contained in main memory 905. Such instructions can be read into main memory 905 from another computer-readable medium, such as the storage device 909. Execution of the arrangement of instructions contained in main memory 905 causes the processor 903 to perform the process steps described herein. One or more processors in a multi-processing arrangement may also be employed to execute the instructions contained in main memory 905. In alternative embodiments, hard-wired circuitry may be used in place of or in combination with software instructions to implement the embodiment of the invention. In another example, reconfigurable hardware such as Field Programmable Gate Arrays (FPGAs) can be used, in which the functionality and connection topology of its logic gates are customizable at run-time, typically by programming memory look up tables. Thus, embodiments of the invention are not limited to any specific combination of hardware circuitry and software.

The computing system 900 also includes at least one communication interface 915 coupled to bus 901. The communication interface 915 provides a two-way data communication coupling to a network link (not shown). The communication interface 915 sends and receives electrical, electromagnetic, or optical signals that carry digital data streams representing various types of information. Further, the communication interface 915 can include peripheral interface devices, such as a Universal Serial Bus (USB) interface, a PCMCIA (Personal Computer Memory Card International Association) interface, etc.

The processor 903 may execute the transmitted code while being received and/or store the code in the storage device 909, or other non-volatile storage for later execution. In this manner, the computing system 900 may obtain application code in the form of a carrier wave.

The term "computer-readable medium" as used herein refers to any medium that participates in providing instructions to the processor 903 for execution. Such a medium may take many forms, including but not limited to non-volatile media, volatile media, and transmission media. Non-volatile media include, for example, optical or magnetic disks, such as the storage device 909. Volatile media include dynamic memory, such as main memory 905. Transmission media include coaxial cables, copper wire and fiber optics, including the wires that comprise the bus 901. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the invention may initially be borne on a magnetic disk of a remote computer. In such a scenario, the remote computer loads the instructions into main memory and sends the instructions over a telephone line using a modem. A modem of a local system receives the data on the telephone line and uses an infrared transmitter to convert the data to an infrared signal and transmit the infrared signal to a portable computing device, such as a personal digital assistant (PDA) or a laptop. An infrared detector on the portable computing device receives the information and instructions borne by the infrared signal and places the data on a bus. The bus conveys the data to main memory, from which a processor retrieves and executes the instructions. The instructions received by main memory can optionally be stored on storage device either before or after execution by processor.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method that uses a processor to develop an overlap distance for direct patterning using an optical lithography, the method comprising:
    detecting light amount distributions and positions of each light spot generated from an optical head to a substrate, the substrate comprising a first area and a second area;
    generating a compensation model of each of the light spots by applying a Gaussian distribution function to the respective positions and light amount distributions of the light spots;
    calculating, by the processor, using the compensation model, a first accumulated light amount of a first light spot corresponding to the first area of the substrate, the optical head being first scanned along a first direction of the substrate;
    calculating, by the processor, using the compensation model, a second accumulated light amount of a second light spot corresponding to the second area overlapped with the first area, a first overlapped area being occurred when the optical head is second scanned along the first direction after being moved in a second direction by a first distance; and
    determining an overlap distance according to a uniformity of summations of the first accumulated light amount and the second accumulated light amount.

2. The method of claim 1, wherein the overlap distance is determined if the summation of the accumulated light amounts with respect to the first light spot and the second light spot is uniform.

3. The method of claim 1, wherein determining the overlap distance comprises:
    calculating, using the compensation model, a third accumulated light amount corresponding to respective positions of a third area overlapped with the first area, a second overlapped area being occurred when the optical head being third scanned along the first direction after being moved in the second direction by a second distance and the summations of the accumulated light amount being determined as non-uniform; and
    determining a width of the third area along the second direction to control an overlap distance of the optical head according to a uniformity of the summation of the first accumulated light amount and the third accumulated light amount.

4. The method of claim 1, wherein calculating the first accumulated light amount and the second accumulated light amount further comprises:
    calculating an accumulated light amount of the substrate if the optical head is inclined with respect to the substrate to scan the substrate.

5. The method of claim 1, wherein the overlap distance is about 190 µm to about 210 µm.

6. The method of claim 1, wherein the optical head comprises a light modulation element and an optical system, wherein the light modulation element comprises a digital micro-mirror device (DMD).

7. An optical device, comprising:
    an optical head comprising a light modulation element to convert light into light comprising plural light paths, the optical head to generate a plurality of laser beams to a substrate by using the light modulation element;

a non-transitory readable storage medium comprising one or more parts, executable by a processor, the one or more parts comprising;
a measuring part to detect positions and light amount distribution of each of light spots incident on a substrate; and
a calculating part to calculate a compensation model of each of the light spots by applying Gaussian distribution to the detected positions and light amount distributions, and
to calculate a first accumulated light amount of a first light spot corresponding to a first area of the substrate when the optical head is scanned along a first direction of the substrate, and the calculating part to calculate a second accumulated light amount of a second light spot corresponding to a second area overlapped with the first area, a first overlapped area being occurred when the optical head is second scanned along the first direction after being moved in a second direction by a first distance, wherein
an overlap distance is determined according to a uniformity of summation of the first accumulated light amount and the second accumulated light amount.

8. The device of claim 7, wherein
the overlap distance is determined if the summation of the accumulated light amounts with respect to the first light spot and the second light spot is uniform.

9. The device of claim 7, wherein the calculating part is configured to calculate a third accumulated light amount of a third light spot corresponding to the respective positions of a third area overlapped with the first area, a second overlapped area being occurred if the optical head is scanning along the first direction and in the second direction, the scanning movement being determined by a second distance if the summation of the first accumulated light amount and the second accumulated light amount is determined as non-uniform, and wherein
a width of the third area along the second direction is determined as the overlap distance if the summation of the first accumulated light amount and the third accumulated light amount is uniform.

10. The device of claim 7, further comprising:
a stepping control part configured to control a stepping of the optical head in the second direction,
wherein the stepping control part is configured to move the optical head to overlapped areas in which the light spots being scanned are overlapped with each other by determining the overlap distance, a scanning movement of the optical head is controlled prior to the substrate being scanned in the first direction after the substrate is scanning the substrate in the first direction.

11. The device of claim 7, wherein the calculating part is configured to calculate an accumulated light amount of the substrate if the optical head is inclined with respect to the substrate to scan the substrate.

12. The device of claim 7, wherein the overlap distance is about 190 μm to about 210 μm.

13. The device of claim 7, wherein the light modulation element comprises a digital micro-mirror device (DMD).

14. The device of claim 13, wherein the DMD comprises a plurality of micro-mirrors arranged in a matrix, and
the micro-mirrors are configured to convert light provided from a light source into a plurality of laser beams to have light paths different from one another, and to provide the converted laser beams as the light spots.

15. The device of claim 14, further comprising:
a mirror control part configured to control activation or inactivation of the micro-mirrors to selectively provide the light spots to an area corresponding to a pattern to be formed on the substrate.

16. The device of claim 15, wherein the mirror control part is configured to output activation data or inactivation data to each of the micro-mirrors by using an image data for the pattern, and
an area where the activation data being scanned is exposed, and an area where the inactivation data being scanned is not exposed.

17. An apparatus, comprising:
at least one non-transitory storage medium comprising at least one part, executable by a processor, the at least one part comprising,
a compensation part, executable by a processor, configured to detect an overlapped area in a direct patterning using an optical lithography to compensate errors associated with the overlapped area,
wherein the overlapped area is determined, by the processor, by measuring positions and light amount of each light spot distributed on a substrate and a distribution is calculated by applying a Gaussian distribution to the measured positions and light amount distribution, wherein the substrate comprises a first area comprising a plurality of sectors and a second area comprising a plurality of sectors, and a first accumulated amount is measured corresponding to the respective sectors of the first area in response to detection of an optical head scanning in a first direction and a second accumulated amount is measured corresponding to the respective sectors of the second area overlapped with the sectors of the first area in response to detection of the optical head is second scanned in the first direction after being moved in a second direction by a first distance; and
a control part, executable by the processor, configured to control of a mirror arranged in a matrix, the control being associated with selectively activating and inactivating light incidence on the substrate, wherein the mirror is controlled by determining the overlapped area, wherein the overlapped area is determined in response to detection of a uniformity of the summation of the first accumulated light amount and the second accumulated light amount.

18. A method, comprising:
detecting light amount distribution and each position of light spots generated from an optical head for direct patterning on a substrate, the light spots comprising a first area and a second area;
determining a first accumulated light amount corresponding to each light spot of the first area of the substrate, the optical head being scanned along a first direction of the substrate using a compensation model, wherein the compensation model is provided by applying Gaussian distribution function to respective positions of the light spots and the light amount distributions;
determining, using the compensation model, a second accumulated light amount corresponding to each light spot of the second area overlapped with the first area the overlapped area being occurred if the optical head is second scanned along the first direction after being moved in a second direction by a first distance; and
controlling a stepping distance of the optical head to generate uniform light incidence with respect to the overlapped area based on the determination of the first and second accumulated light amounts.

19. The method of claim 18, wherein the optical head comprising a plurality of optical heads for producing a plurality of patterns on the substrate and a distance of an arrangement of each of the plurality of optical heads is determined based on the determination of the first and second accumulated light amount.

* * * * *